(12) United States Patent
Abe

(10) Patent No.: US 6,774,444 B2
(45) Date of Patent: Aug. 10, 2004

(54) SEMICONDUCTOR, SOLID-STATE IMAGING DEVICE, AND METHOD FOR MAKING THE SAME

(75) Inventor: Hideshi Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/348,820

(22) Filed: Jan. 22, 2003

(65) Prior Publication Data

US 2003/0210580 A1 Nov. 13, 2003

(30) Foreign Application Priority Data

Jan. 24, 2002 (JP) ........................................ 2002-015078

(51) Int. Cl.[7] .............................................. H01L 27/14
(52) U.S. Cl. .................... 257/414; 257/53; 257/108; 257/225; 257/252; 438/48; 438/49; 438/51; 438/54; 438/570
(58) Field of Search ............................. 257/53–56, 108, 257/225, 252, 414; 438/48, 49, 51, 54, 570

(56) References Cited

U.S. PATENT DOCUMENTS 5,523,609 A * 6/1996 Fukusho ..................... 257/435
6,147,390 A * 11/2000 Nakano et al. ............. 257/437
6,436,729 B1 * 8/2002 Abe ............................ 438/60

* cited by examiner

Primary Examiner—David Nelms
Assistant Examiner—Andy Huynh
(74) Attorney, Agent, or Firm—Robert J. Depke; Holland & Knight LLP

(57) ABSTRACT

A method for making a solid-state imaging device that can form a first P-type well region deep in a substrate without being affected by the heat applied during an epitaxial growth process is disclosed. The method includes a first step of preparing a substrate composite comprising an first substrate and a second substrate on the first substrate, a second step of implanting impurity ions from the surface of the second substrate at an energy exceeding 3 MeV so as to form a barrier layer, and a third step of forming a photosensor in the second substrate.

20 Claims, 4 Drawing Sheets

PRIOR ART
FIG. 5A
FIG. 5B
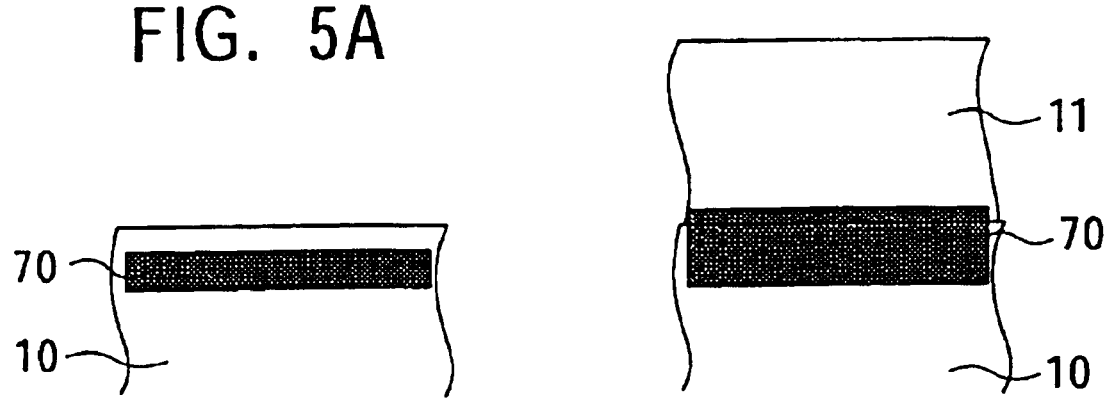
FIG. 5C
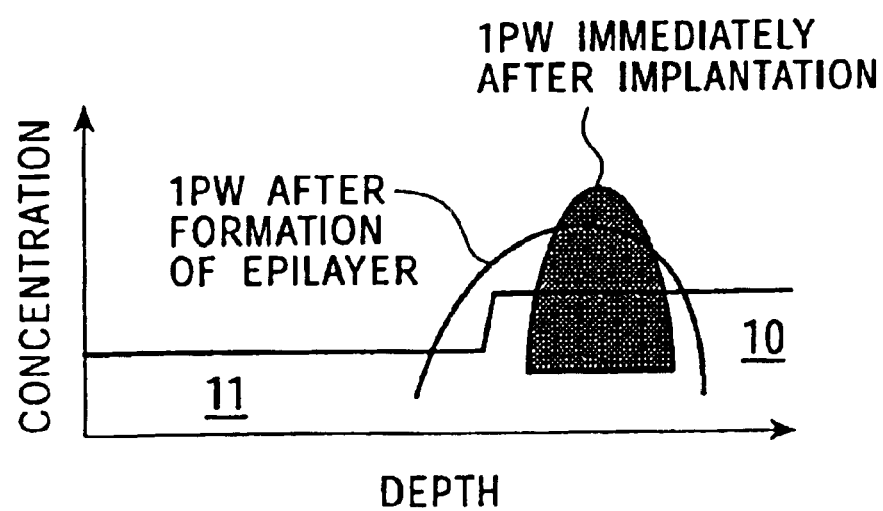

SEMICONDUCTOR, SOLID-STATE IMAGING DEVICE, AND METHOD FOR MAKING THE SAME

This application claims priority to Japanese Patent Application Number JP2002-015078 filed Jan. 24, 2002, which is incorporated herein by reference.

BACKGROUND OF THE INVENTION

1. Field of the Invention

The present invention relates to a semiconductor device with a charge-storing unit, to a solid-state imaging device such as a charge-coupled device (CCD) image sensor or a complementary metal-oxide semiconductor (CMOS) image sensor, and to a method for making the semiconductor device or the solid-state imaging device.

2. Description of the Related Art

FIG. 4 is a cross-sectional view showing an example layer structure around a pixel unit of a conventional CCD solid-state imaging device.

The solid-state imaging device includes an epitaxial layer 11 formed on an N-type silicon substrate 10. The epitaxial layer 11 includes a photosensor unit (photodiode) 20 that functions as an imaging pixel and a CCD vertical transfer unit 30. A dotted line α indicates the border between the epitaxial layer 11 and the substrate 10.

The vertical transfer unit 30 is formed as a strip extending in a direction perpendicular to the plane of paper in FIG. 4. A plurality of vertical transfer units 30 is aligned at a regular interval.

Each photosensor unit 20 is formed as a dot that constitutes a two-dimensional matrix. The photosensor units 20 generate signal charges by photoelectric conversion of light incident on the substrate surface and store the generated signal charges.

Referring again to FIG. 4, a transfer electrode 40 is disposed in a region directly above the vertical transfer unit 30 and at the top of the epitaxial layer 11. The transfer electrode 40 is separated from the vertical transfer unit 30 by an insulating film (not shown) therebetween. Each of the transfer electrodes 40 is formed as a strip extending in a direction parallel to the plane of paper of FIG. 4. The transfer electrodes 40 are sequentially aligned in a direction perpendicular to the plane of the paper of FIG. 4.

A vertical-transfer clock pulse is applied to the transfer electrode 40 so as to sequentially transfer the signal charges read out from the photosensor unit 20 to the vertical transfer unit 30. The transferred signal charges are output to a horizontal transfer unit (not shown).

The horizontal transfer unit that received the signal charges from the vertical transfer unit 30 transfers the signal charges in the horizontal direction, i.e., the direction parallel to the plane of the paper of FIG. 4, so as to output the signal charges to a charge-detection amplifier (not shown). The charge-detection amplifier converts the signal charges to voltage signal or current signal and outputs the converted signals.

A light-shielding film 50 is formed to cover each transfer electrode 40. The transfer electrode 40 is separated from the light-shielding film 50 by an insulating film (not shown) therebetween.

An opening 52 is formed between the light-shielding films 50 to expose the light-receiving surface of the photosensor unit 20. While light enters the photosensor unit 20 via the opening 52, the light-shielding film 50 inhibits light from entering the sections other than the photosensor unit 20.

An on-chip-lens (OCL) 60 for condensing incident light is formed above the light-shielding film 50.

An embedded transfer channel 32 and a second P-type well region (2PW) 34 surrounding the transfer channel 32 are formed in the epitaxial layer 11. The transfer channel 32 and the second P-type well region (2PW) 34 form a transfer path for the signal charges and thus function as the vertical transfer unit 30.

An overflow barrier (OFB) layer that allows a vertical overflow structure is formed under the photosensor unit 20. The OFB layer is a potential barrier prepared by forming a first P-type well region (1PW, shaded region in FIG. 4) 70 in the silicon substrate 10.

The photosensor unit 20 consists of an upper layer, which is a P-type impurity region, and a lower layer, which is an N-type impurity region. The region around the interface between the N-type impurity region and the OFB layer is a depletion region. The charges generated in and around the depletion region flow into the photosensor unit 20 via the depletion region.

Accordingly, in order to improve the sensitivity of the photosensor unit 20, the depletion region must be extended over a wider range. In order to extend the depletion region, the position of the first P-type well region (1PW) 70 in the substrate must deep.

Conventionally, in order to form the first P-type well region 70 at a deep position, boron ions for forming P-type well region 70 are first implanted in the silicon substrate 10, and the epitaxial layer 11 of N-type is then formed on the implanted silicon substrate 10.

To be more specific, referring to FIG. 5A, a resist mask with openings is placed on the N-type silicon substrate 10 (first substrate), and ions of a P-type impurity are implanted into the N-type silicon substrate 10 to form the first P-type well region 70. As shown in FIG. 5B, a lightly doped N-type epitaxial layer (second substrate) is then formed, and, subsequently, a transfer channel, a photosensor, and the like are formed in the epitaxial layer.

However, growing of the N-type epitaxial layer after ion plantation has the following problems.

First, a high temperature of, for example, approximately 1,100° C. or more is necessary to form the epitaxial layer 11. Because of the high temperature, boron ions for forming the first P-type well region 70 implanted into the N-type silicon substrate 10 diffuse externally. As a result, as shown in FIG. 5C, the distribution of the boron concentration in the first P-type well region 70 becomes more spread compared with the boron distribution concentration immediately after the implantation.

Since both the substrate 10 and the epitaxial layer 11 are N-type, the difference in concentration between the substrate and the epitaxial layer contributes as a p-type impurity. However, the amount of the difference is easily changed according to the growth conditions of the epitaxial layer.

For example, when the process time is long, a significantly large amount of boron ions are driven out by external diffusion. Moreover, the n-type impurity is also driven out due to external diffusion. External diffusion of impurities become significant and the amount of impurities becomes highly unpredictable as the temperature is increased.

Moreover, external diffusion continues even during formation of the epitaxial layer. Since impurity ions also diffuse into the growing epitaxial layer, the amount of the impurity ions becomes further unstable.

In order to form the epitaxial layer, $SiH_4$, dichlorosilane, trichlorosilane, or the like that contains phosphorus or arsenic as the N-type impurity is used. The type of impurity for the epitaxial layer is selected depending on the partial pressure of the N-type impurity in the gas, the growth rate, and the process time. The boron ions that have been driven out by external diffusion may be incorporated into the epitaxial layer, thereby degrading the controllability of the amount of the impurity.

Accordingly, the impurity concentration of the first P-type well region 70 and that of the epitaxial layer 11 are difficult to control.

The instability in impurity concentration in these regions results in instability in formation of the depletion region. Moreover, it also results in varying of the voltages applied to the substrate during accumulation of saturating signal charges and in varying of high voltages applied to the substrate for flushing the charges in the substrate direction, i.e., voltages for operating electronic shutters.

Furthermore, because the impurity concentration in the photosensor is widely distributed, the size of the depletion region change accordingly. Since incident light reaches a different depth depending on the wavelength, there is a problem in that the sensitivity varies depending on the wavelength.

As described above, according to known methods, layer structures that are sensitive to long wavelengths cannot be stably formed, and the yield is difficult to improve. Moreover, not every imaging device has the designed structure.

The reason for forming the epitaxial layer subsequent to the formation of the first P-type well region 70 is as follows. The ion implantation apparatus used to implant boron ions can only perform implantation at a low injection energy; accordingly, ion implantation at a deep position of the substrate is difficult.

However, recently, ion implantation apparatuses with high implantation energy are available. They may be used in manufacturing of solid-state imaging devices such as those described above. Since the position of forming the OFB layer directly affects the characteristics of the photosensor, ion implantation must be performed in highly stable conditions.

SUMMARY OF THE INVENTION

It is an object of the present invention to eliminate adverse affects of the temperature for forming an epitaxial layer on formation of a first-P-type well region at the deep position of the substrate. According to the present invention, the first P-type well region can be formed at a desired position by adequate ion implantation so as to effectively form an overflow barrier layer. In this manner, a highly sensitive solid-state imaging device or a semiconductor device can be formed. A method for making the solid-state imaging device or the semiconductor device is also provided.

To achieve these goals, an aspect of the present invention provides a solid-state imaging device comprising a substrate composite comprising a first substrate and a second substrate formed on the first substrate, a photosensor for generating signal charges in response to incident light, the photosensor being formed in the second substrate, and a barrier layer formed under the photosensor. The barrier layer is formed by implanting impurity ions from the surface of the second substrate at an energy exceeding 3 MeV. According to this structure, the barrier layer does not suffer from problems arising from the formation of the second substrate.

Another aspect of the present invention provides a method for making a solid-state imaging device comprising a first step of preparing a substrate composite comprising a first substrate and a second substrate on the first substrate, a second step of implanting impurity ions from the surface of the second substrate at an energy exceeding 3 MeV so as to form a barrier layer, and a third step of forming a photosensor in the second substrate. In this manner, the process of forming the second substrate does not affect the barrier layer.

Yet another aspect of the present invention provides a semiconductor device comprising a substrate composite comprising a first substrate and a second substrate formed on the first substrate, a charge-storing region formed in the second substrate, and a barrier layer formed under the charge-storing region. The barrier layer is formed by implanting impurity ions from the surface of the second substrate at an energy exceeding 3 MeV. According to this structure, the barrier layer does not suffer from problems arising from the formation of the second substrate.

Yet another aspect of the present invention provides a method for making a semiconductor device comprising a first step of preparing a substrate composite comprising a first substrate and a second substrate on the first substrate, a second step of implanting impurity ions from the surface of the second substrate at an energy exceeding 3 MeV so as to form a barrier layer, and a third step of forming a charge-storing unit in the second substrate. In this manner, the process of forming the second substrate does not affect the barrier layer.

BRIEF DESCRIPTION OF THE DRAWINGS

FIG. 5A shows a step of making the solid-sate imaging device shown in FIG. 4;

FIG. 5B shows another step of making the solid-state imaging device shown in FIG. 4; and FIG. 5C shows the impurity distribution of the solid-state imaging device shown in FIG. 4.

DESCRIPTION OF THE PREFERRED EMBODIMENTS

The embodiments of the present invention will now be described in detail with reference to the drawings.

The embodiments below are for the illustrative purpose only and various preferable technical limitations described herein do not limit the scope of the present invention unless otherwise noted.

In the embodiments of the present invention, implantation of ions such as boron ions is performed after formation of an epitaxial layer on a silicon substrate using high energy exceeding 3 MeV so as to substantially uniformly implant P-type impurity ions into a wafer. In this manner, a first P-type well region having a stable impurity distribution can be formed at a deep position of the silicon substrate, and the effect of the heat applied during the process of epitaxial growth can be minimized. Moreover, the impurity profile of the epitaxial layer and the first P-type well region, i.e., a barrier layer, can be controlled.

Figure 1A:
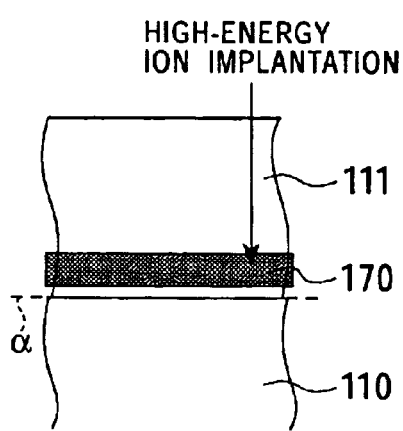
FIG. 1A is a schematic diagram illustrating an ion implantation process for making a solid-state imaging device of a first embodiment of the present invention.
Figure 1B:
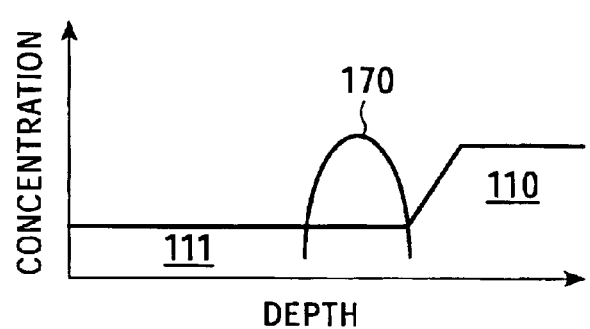
FIG. 1B is a graph showing an impurity distribution profile of the solid-state imaging device.

FIG. 1A is a schematic diagram illustrating the ion implantation operation for making a solid-state imaging device of a first embodiment of the present invention. FIG. 1B is a graph showing an impurity distribution profile of the solid-state imaging device.

Figure 2A:
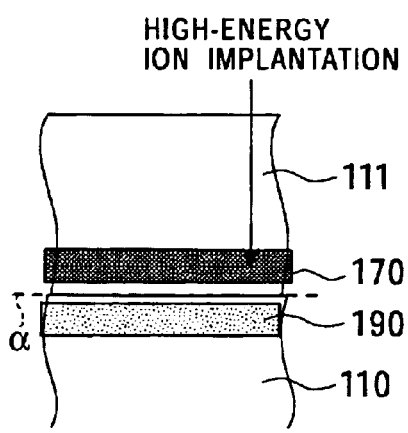
FIG. 2A is a schematic diagram illustrating an ion implantation process for making a solid-state imaging device of a second embodiment of the present invention.

FIG. 2A is a schematic diagram illustrating the ion implantation operation for making a solid-state imaging device of a second embodiment of the present invention. FIG. 2A is a graph showing an impurity distribution profile of the solid-state imaging device.

Figure 3:
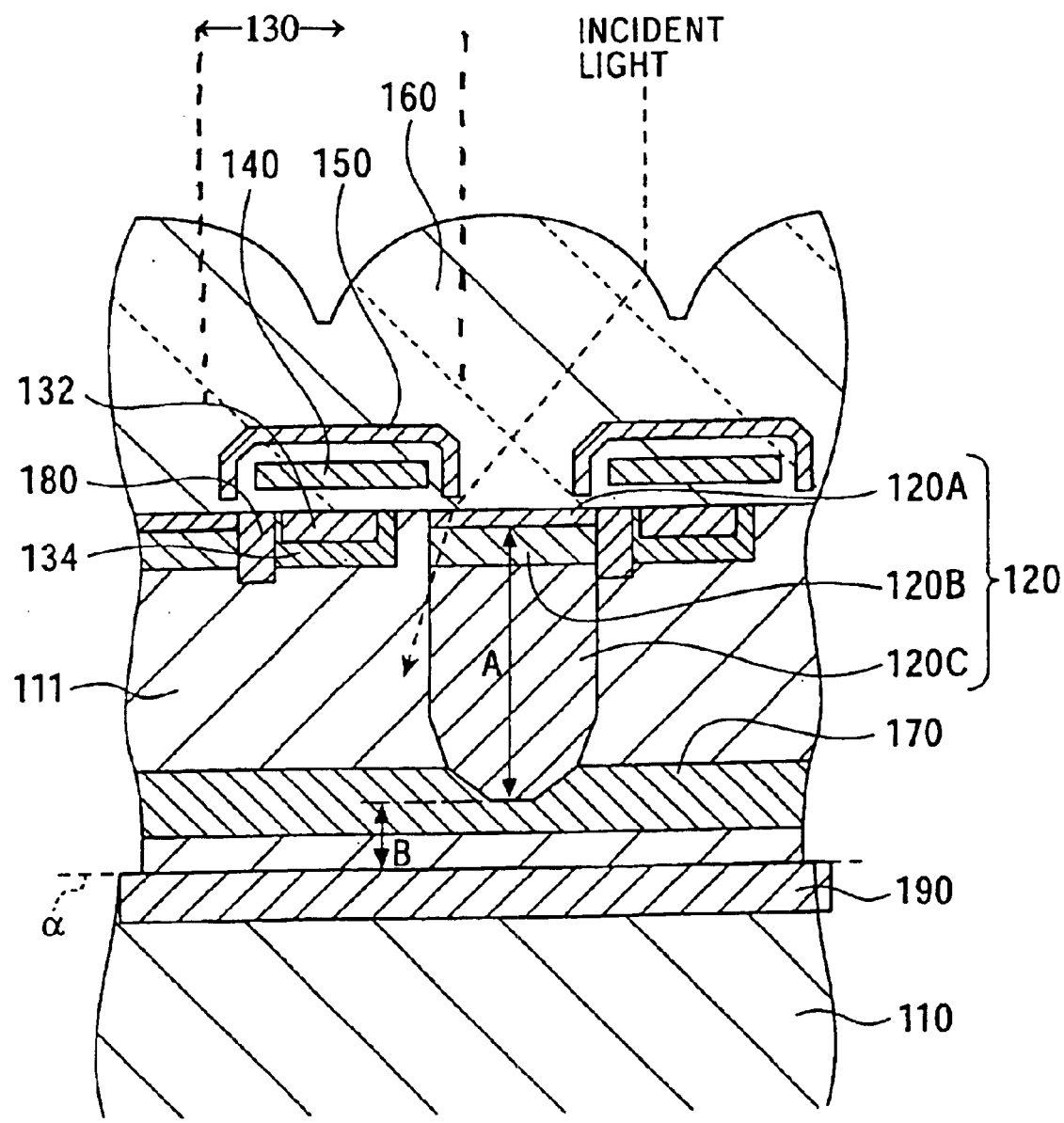
FIG. 3 is a cross-sectional view of an example solid-state imaging device made through the ion implantation step shown in FIG. 1A or 2A.

FIG. 3 is a cross-sectional view of an example solid-state imaging device made through the ion implantation step shown in FIGS. 1A and 2A. Note when the solid-state imaging device is made through the step shown in FIG. 1A, the region 190 is not formed.

A solid-state imaging device according to present invention will now be described with reference to FIG. 3.

Figure 4:
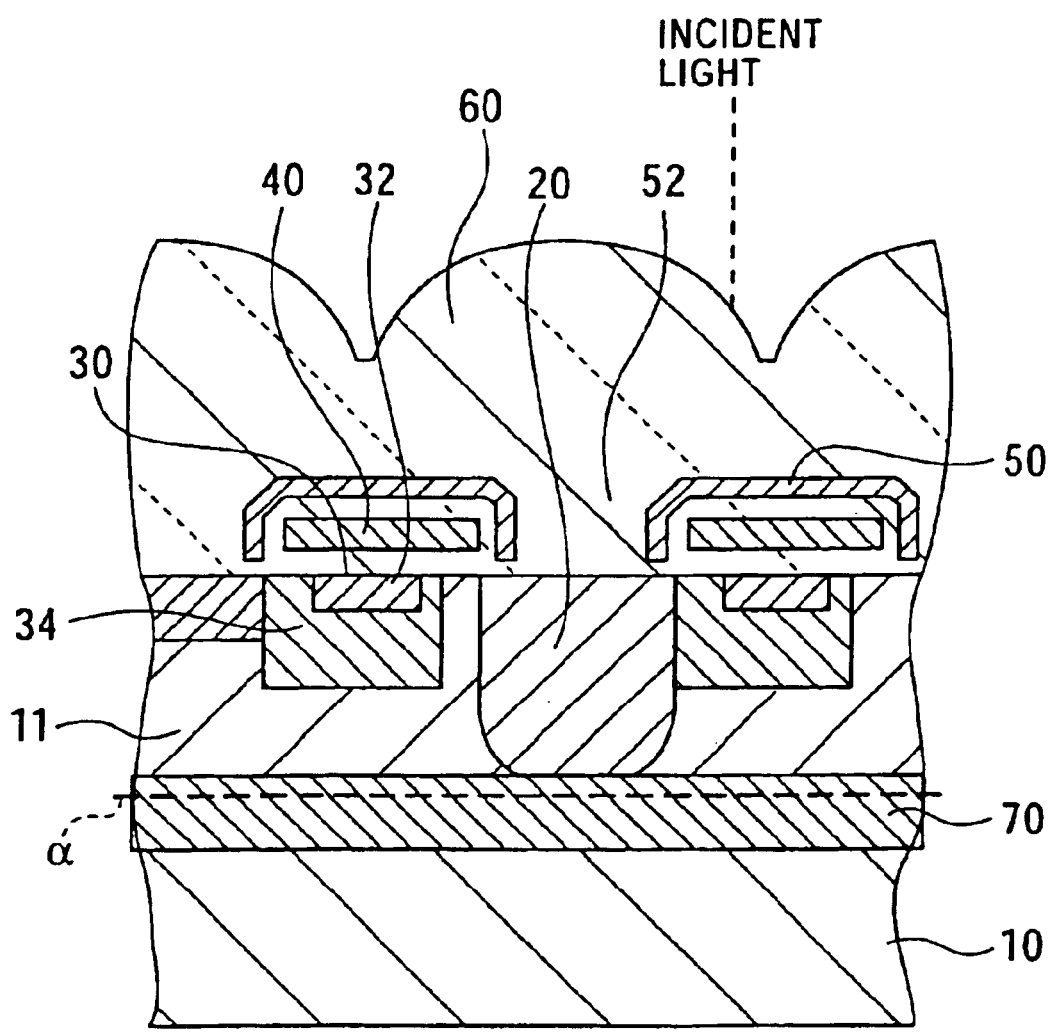
FIG. 4 is a cross-sectional view of an example of a known solid-state imaging device.

The structure of the solid-state imaging device is basically the same as that of a known device shown in FIG. 4. In particular, the solid-state imaging device comprises an N-type silicon substrate (first substrate) 110, an epitaxial layer (second substrate) 111, a photosensor 120, a vertical transfer unit 130, a transfer electrode 140, a light-shielding film 150, an opening 152, an on-chip-lens (OCL) 160, a first P-type well region (1PW) 170, an embedded transfer channel 132, and a second P-type well region (2PW) 134. Although these components are common to the known example shown in FIG. 4, the arrangement, the depth, and the like are different.

As shown in FIG. 3, the photosensor 120 is constituted from a P-type impurity region 120A, a first N-type impurity region 120B, and a second N-type impurity region 120C. The solid-imaging device also includes an isolation (LOCOS) layer 180 for isolating each pixel.

A first embodiment of a method for making the solid-state imaging device will now be described.

The epitaxial layer (second substrate) 111 is formed on the N-type silicon substrate (first substrate) 110 to prepare a substrate composite. The impurity concentration of the epitaxial layer (second substrate) 111 is adjusted to be lower than the impurity concentration of the N-type silicon substrate (first substrate) 110. For example, the impurity concentration of the epitaxial layer (second substrate) 111 is 1 E14 or less.

An oxide layer is then formed on the surface of the substrate composite. A resist layer having an opening for forming the first P-type well region (1PW) 170 is disposed on the oxide layer. Boron ions are implanted through the opening at a concentration of, for example, 5 E10 to 3 E11 using an implantation energy of more than 3 MeV but not more than 10 MeV so as to form the first P-type well region (1PW) 170 at a depth of approximately 4 to 12 μm from the surface of the substrate composite. Note that a conventionally employed ion implantation apparatus having a maximum energy of 3 MeV can only form the layer at a depth of 4 μm in terms of projected range $R_p$.

N-type ions are then injected deep in the region where the photosensor 120 is to be formed at a concentration of approximately 1 E12 so as to form the second N-type impurity region 120C.

Subsequently, the vertical transfer unit 130, the transfer electrode 140, the P-type impurity region 120A, the first N-type impurity region 120B, and the light-shielding film 150 are formed according to a known process.

In the first embodiment, the first P-type well region (1PW) 170 is formed after the epitaxial growth process that requires high temperatures. Accordingly, the first P-type well region (1PW) 170 having a controlled concentration profile can be formed at a deep position of the substrate, as shown by arrows A and B in FIG. 3. Thus, highly sensitive pixels having stable characteristics can be manufactured at good reproducibility. Note that in the example shown in FIG. 3, the first P-type well region (1PW) 170 is formed at the lower portion of the epitaxial layer (second substrate) 111 so as to be close to the N-type silicon substrate (first substrate) 110.

Since the epitaxial layer (second substrate) 111 has a high impurity concentration, the distance between the epitaxial layer (second substrate) 111 and the first P-type well region (1PW) 170 is shortened while achieving good controllability, as shown by the arrow B in FIG. 3. Accordingly, the voltage applied to the substrate in order to flush charges (electronic shutter operation) can be reduced. Whereas the distance between the epitaxial layer (second substrate) 111 and the N-type silicon substrate (first substrate) 110 has been affected by the epitaxial growth, the distance can be stably controlled according to this embodiment.

A second embodiment of a method for making the solid-state imaging device will now be described.

Figure 2B:
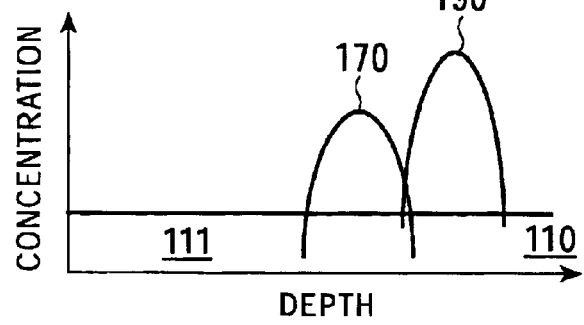
FIG. 2B is a graph showing an impurity distribution profile of the solid-state imaging device.

Referring to FIG. 2, in the second embodiment, an $N^+$-type impurity layer, i.e., a region 190 shown in FIGS. 2 and 3, is formed at the top face of the N-type silicon substrate (first substrate) 110 by ion implantation prior to the epitaxial growth process. Examples of the N-type impurity ions include arsenic ions and phosphorus ions. The epitaxial layer (second substrate) 111 is then formed by an epitaxial process. As in the first embodiment, during the formation of the epitaxial layer (second substrate) 111, boron ions are implanted at high energy. The impurity concentration of the N-type silicon substrate (first substrate) 110 is substantially the same as that of the epitaxial layer (second substrate) 111.

According to the second embodiment, the voltage applied to the substrate in order to flush charges (electronic shutter operation) can be reduced. Whereas the distance between the epitaxial layer (second substrate) 111 and the N-type silicon substrate (first substrate) 110 has been affected by the epitaxial process, the distance can be stably controlled according to this embodiment.

In these embodiments of the present invention, the first P-type well region (1PW) 170 is formed by implantation of boron ions at high energy exceeding 3 MeV after the formation of the epitaxial layer (second substrate) 111. Thus, the first P-type well region (1PW) 170 having a controlled concentration distribution and a smaller thickness, i.e., a smaller depth, can be formed. The further advantages of the above-described embodiments of the present invention are as follows.

(1) The photosensor and the depletion region can be formed at good controllability and reproducibility. As a result, an imaging device having a significantly small variation in optical characteristics can be manufactured.

(2) Variations resulting from the performance of the epitaxial growth system can be significantly reduced. For example, variation in the substrate voltages for controlling the saturating signal charges, variation in the planarity of the wafer, and lot-to-lot variation of wafers can be improved. As a result, the pixel designing can be simplified, and stable production becomes possible.

(3) The substrate shutter voltage is lowered and becomes highly controllable.

Although the above embodiments are described in terms of the solid-state imaging device with the photosensor 120, the present invention can be applied to other semiconductor devices with charge-storing units having the same structure as that of the photosensor 120 and to methods for making such semiconductor devices. In such a case, the advantages described in the above paragraphs (2) and (3) can still be obtained.

The application of the present invention is not limited to the above-described embodiments. The present invention can be widely applied to other types of solid-state imaging device, semiconductor devices, and methods for making these devices.

For example, the impurity used in the ion implantation, the concentration, and the energy of the ion implantation are not limited to the above embodiments. Various modifications are possible without departing from the spirit of the present invention.

Moreover, the P-type impurity region 120A of the photosensor 120 need not be formed. The isolation (LOCOS) layer 180 may be replaced by a P-type semiconductor layer commonly employed in solid-state imaging devices having a CCD structure. Although the photosensor 120 of the above embodiments includes two N-type impurity regions, the number of N-type impurity regions is not limited to two. It may be 1 or 3 or more. The layers and the impurity regions in the substrate composite may overlap at the edges thereof.

What is claimed is:

1. A solid-state imaging device comprising:
    a substrate composite comprising a first substrate and a second substrate formed on the first substrate;
    a photosensor for generating signal charges in response to incident light, the photosensor being formed in the second substrate; and
    a barrier layer formed under the photosensor, wherein the barrier layer is formed by implanting impurity ions through a top surface of the second substrate at an energy exceeding 3 MeV.

2. The solid-state imaging device according to claim 1, wherein the second substrate is formed by epitaxial growth.

3. The solid-state imaging device according to claim 1, wherein the second substrate is an N-type semiconductor; and the barrier layer is a P-type semiconductor and lies in the second substrate.

4. The solid-state imaging device according to claim 3, wherein the photosensor comprises N-type impurity regions formed in the second substrate at different depths, the N-type impurity regions having different impurity concentrations.

5. The solid-state imaging device according to claim 1, wherein the first substrate and the second substrate are N-type semiconductors, and the impurity concentration of the second substrate is lower than the impurity concentration of the first substrate.

6. The solid-state imaging device according to claim 1, wherein the barrier layer lies in a lower half portion of the second substrate that is near the first substrate.

7. The solid-state imaging device according to claim 1, further comprising an impurity layer formed in the first substrate, the impurity layer having the same conductivity type as that of the barrier layer, wherein the peak concentration of the impurity layer is higher than that of the barrier layer.

8. The solid-state imaging device according to claim 7, wherein the impurity layer partially overlaps the barrier layer.

9. The solid-state imaging device according to claim 1, wherein the barrier layer lies in a region that includes the border between the first substrate and the second substrate.

10. A method for making a solid-state imaging device comprising:
    a step of preparing a substrate composite comprising a first substrate and a second substrate on the first substrate;
    a step of implanting impurity ions through a top surface of the second substrate at an energy exceeding 3 MeV so as to form a barrier layer; and
    a step of forming a photosensor in the second substrate.

11. The method according to claim 10, wherein the second substrate is formed by epitaxial growth.

12. The method according to claim 10, wherein the barrier layer is formed in a lower half portion of the second substrate that is near the first substrate.

13. The method according to claim 10, wherein the second substrate is an N-type semiconductor;
    the barrier layer is formed by implanting ions of a P-type impurity; and
    the photosensor is formed by implanting ions of an N-type impurity a plurality of times.

14. The method according to claim 11, wherein the first substrate is an N-type semiconductor; and
    the second substrate is an N-type semiconductor having an impurity concentration lower than the impurity concentration of the first substrate.

15. A semiconductor device comprising:
    a substrate composite comprising a first substrate and a second substrate formed on the first substrate;
    a charge-storing region formed in the second substrate; and
    a barrier layer formed under the charge-storing region, wherein the barrier layer is formed by implanting impurity ions through a top surface of the second substrate at an energy exceeding 3 MeV.

16. The semiconductor device according to claim 15, wherein the second substrate is formed by epitaxial growth.

17. The semiconductor device according to claim 15, wherein the second substrate is an N-type semiconductor, and the barrier layer is a P-type semiconductor and is formed in the second substrate.

18. The semiconductor device according to claim 15, wherein the first substrate is an N-type semiconductor having an impurity concentration higher than that of the second substrate.

19. A method for making a semiconductor device comprising:
    preparing a substrate composite comprising a first substrate and a second substrate on the first substrate;
    implanting impurity ions through a top surface of the second substrate at an energy exceeding 3 MeV so as to form a barrier layer; and
    forming a charge-storing unit in the second substrate.

20. The method according to claim 19, wherein the second substrate is formed by epitaxial growth, and the barrier layer is formed in a lower half portion of the second substrate that is near the first substrate.

* * * * *